United States Patent [19]

Azuma

[11] Patent Number: 5,491,654
[45] Date of Patent: Feb. 13, 1996

[54] STATIC RANDOM ACCESS MEMORY DEVICE HAVING THIN FILM TRANSISTOR LOADS

[75] Inventor: Mituhiro Azuma, Tokyo, Japan

[73] Assignee: NEC Corporation, Tokyo, Japan

[21] Appl. No.: 288,276

[22] Filed: Aug. 8, 1994

[30] Foreign Application Priority Data

Aug. 13, 1993 [JP] Japan ................... 5-222218

[51] Int. Cl.⁶ .................................. G11C 11/34
[52] U.S. Cl. .................. 365/156; 365/161; 365/179; 365/182; 257/903; 257/393
[58] Field of Search ...................... 365/156, 161, 365/179, 182; 257/903, 393, 394

[56] References Cited

U.S. PATENT DOCUMENTS

| | | | |
|---|---|---|---|
| 5,281,843 | 1/1994 | Ochii et al. | 257/903 |
| 5,331,170 | 7/1994 | Hayashi | 257/903 |
| 5,334,863 | 8/1994 | Uhkawa et al. | 257/903 |
| 5,391,894 | 2/1995 | Itabashi et al. | 257/903 |

FOREIGN PATENT DOCUMENTS 2-14565  1/1990  Japan .

*Primary Examiner*—Tan T. Nguyen

[57] ABSTRACT

In a static random access memory device where thin film transistors are used memory cell loads, first and second semiconductor layers having source regions, channel regions and drain regions of the thin film transistors partly oppose first and second conductive layers serving as gate electrodes thereof. A third conductive layer for receiving a definite potential opposes at least the channel regions of the first and second semiconductor layers.

15 Claims, 7 Drawing Sheets

P-CHANNEL MOS TRANSISTOR

N-CHANNEL MOS TRANSISTOR

STATIC RANDOM ACCESS MEMORY DEVICE HAVING THIN FILM TRANSISTOR LOADS

BACKGROUND OF THE INVENTION

1. Field of the Invention

The present invention relates to a static random access memory (SRAM) having thin film transistors (TFT's) as loads.

2. Description of the Related Art

A typical SRAM includes a plurality of word lines, a plurality of pairs of bit lines, and static memory cells connected to one of the word lines and one pair of the bit lines. Also, one static memory cell is comprised of a complementary flip-flop formed by two load P-channel metal oxide semiconductor (MOS, broadly, MIS) transistors and two driving N-channel MOS transistors, and transfer gates interposed between the flip-flop and the bit lines.

Recently, TFT's have been used as the above-mentioned load P-channel MOS transistors, to thereby improve the integration and reduce the power dissipation (see: JP-A-HEI2-14565).

In the above-mentioned SRAM using the TFT's as the memory cell loads, however, the threshold voltage of the TFT's is affected by electric fields of the bit lines, and as a result, a driving power supply voltage limit value and a data hold voltage for the memory cells become high. This will be explained later in detail.

SUMMARY OF THE INVENTION

It is, therefore, an object of the present invention to reduce a driving power supply voltage limit value and a data hold voltage for SRAM cells using TFT's as loads.

According to the present invention, in an SRAM where TFT's are used as memory cell loads, first and second semiconductor layers having source regions, channel regions and drain regions of the TFT's partly oppose first and second conductive layers serving as gate electrodes thereof. A third conductive layer for receiving a definite potential opposes at least the channel regions of the first and second semiconductor layers. Thus, the memory cell, particularly, the channel regions of the first and second semiconductor layers are hardly affected by electric fields of conductive layers, such as bit lines, outside of the memory cells.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art SRAM will be explained with reference to FIGS. 1, 2 and 3.

Figure 1:
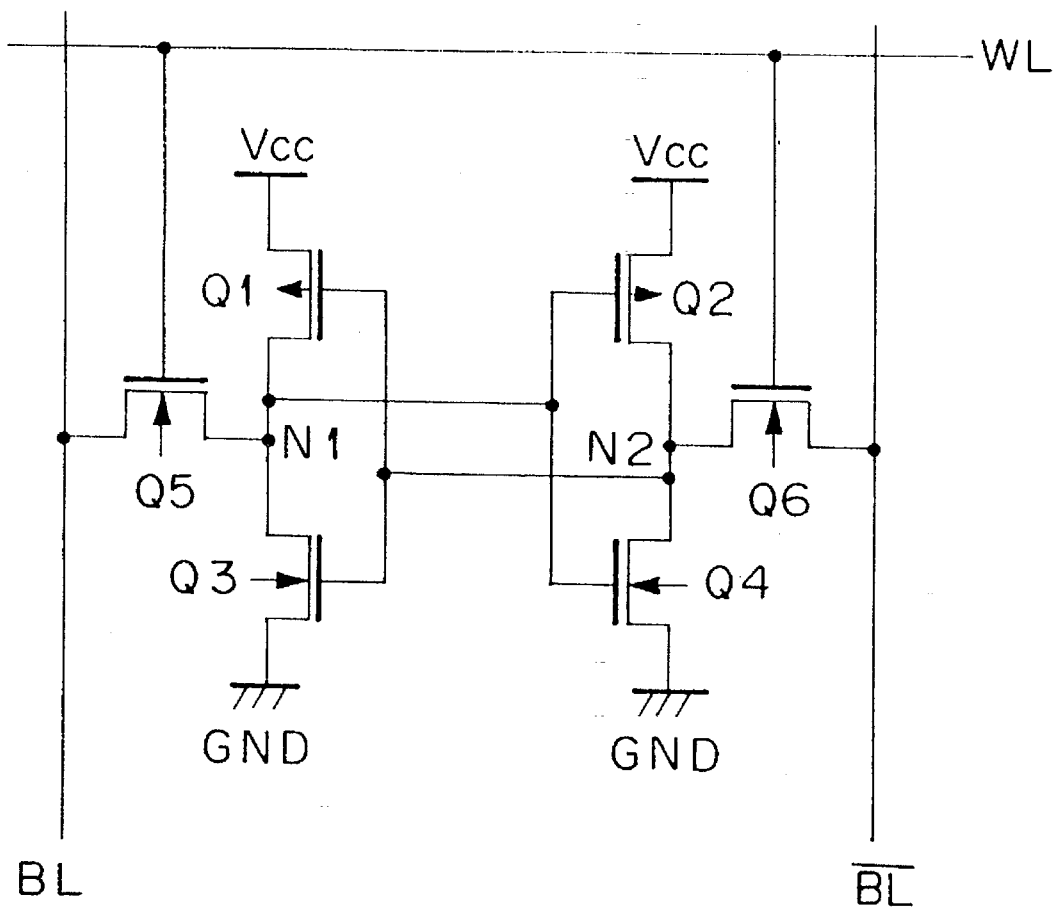
FIG. 1 is a circuit diagram illustrating a prior art SRAM cell.
Figure 1:
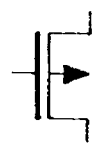
Figure 1:
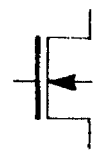

In FIG. 1, which illustrates a prior art SRAM cell connected to a word line WL and bit lines BL and $\overline{BL}$, references Q1 and Q2 designate load P-channel MOS transistors which are, in this case, TFT's, and Q3 and Q4 designate driving N-channel MOS transistors. The P-channel TFT Q1 and the N-channel MOS transistor Q3 are connected in series between power supply terminals $V_{CC}$ and GND to form a first inverter circuit. Also, the P-channel TFT Q2 and the N-channel MOS transistor Q4 are connected in series between the power supply terminals $V_{CC}$ and GND to form a second inverter circuit. An output, i.e., a node N1 of the first inverter circuit is connected to an input of the second inverter circuit, and an output, i.e., a node N2 of the second inverter circuit is connected to an input of the first inverter circuit. Also, the nodes N1 and N2 of the first and second inverter circuits are connected via transfer gates, i.e., N-channel MOS transistors Q5 and Q6 to the bit lines BL and $\overline{BL}$, respectively. Further, gates of the MOS transistors Q5 and Q6 are connected to the word line WL.

The SRAM cell of FIG. 1 is explained next in more detail with reference to FIG. 2 which is a plan view and FIG. 3 which is a cross-sectional view taken along the line A—A of FIG. 2.

References P1, P2 and P3 designate N-type impurity regions within a P-type monocrystalline silicon substrate 1 (FIG. 3), which regions serve as source regions and drain regions of the N-channel MOS transistors Q3 to Q6.

Conductive layers S1, S2 and S3 are made of polycide by polycrystalline silicon and a high melting-point metal such as $MoSi_2$, $Ti_nSi_2$, $TiSi_2$ or $WSi_2$ formed on a thick field silicon oxide layer 2 and a thin gate silicon oxide layer 3 (FIG. 3), and serve as gate electrodes of the N-channel MOS transistors Q3 to Q6. Also, the layer S1 serves as the word line WL.

A conductive layer GND is made of polycide or high melting-point silicide formed on an insulating layer 4, and the ground potential is applied thereto.

Conductive layers TG1 and TG2 are made of polycrystalline silicon formed on an insulating layer (FIG. 3), and serve as gate electrodes of the TFT's Q1 and Q2.

Semiconductor layers TB1 and TB2 are made of polycrystalline silicon obtained by annealing amorphous silicon formed on an insulating layer 6 (FIG. 3), and serve as source regions, channel regions and drain regions of the TFT's Q1 and Q2. In this case, about $1 \times 10^{12}$ to $1 \times 10^{13}$ N-type impurity ions such as phosphorous ions or arsenic ions per square cm are doped into the channel regions, and about $1 \times 10^{15}$ to $1 \times 10^{16}$ P-type impurity ions such a boron ions per square $cm^2$ are doped into the source regions and the drain regions.

Figure 3:
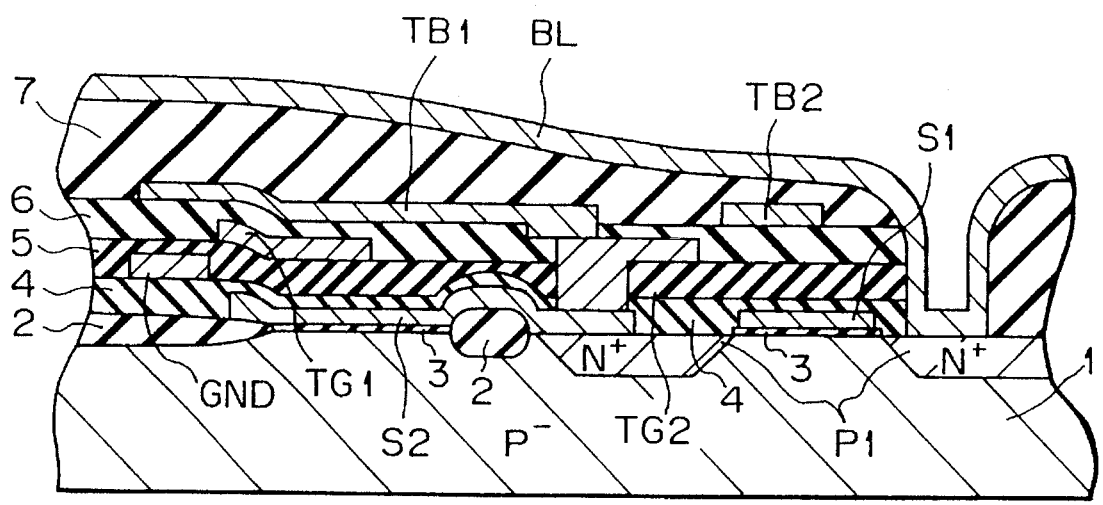
FIG. 3 is a cross-sectional view taken along the line A—A of FIG. 2.

Conductive layers (bit lines) BL and $\overline{BL}$ are made of aluminum formed on an insulating layer 7 (FIG. 3).

Figure 2:
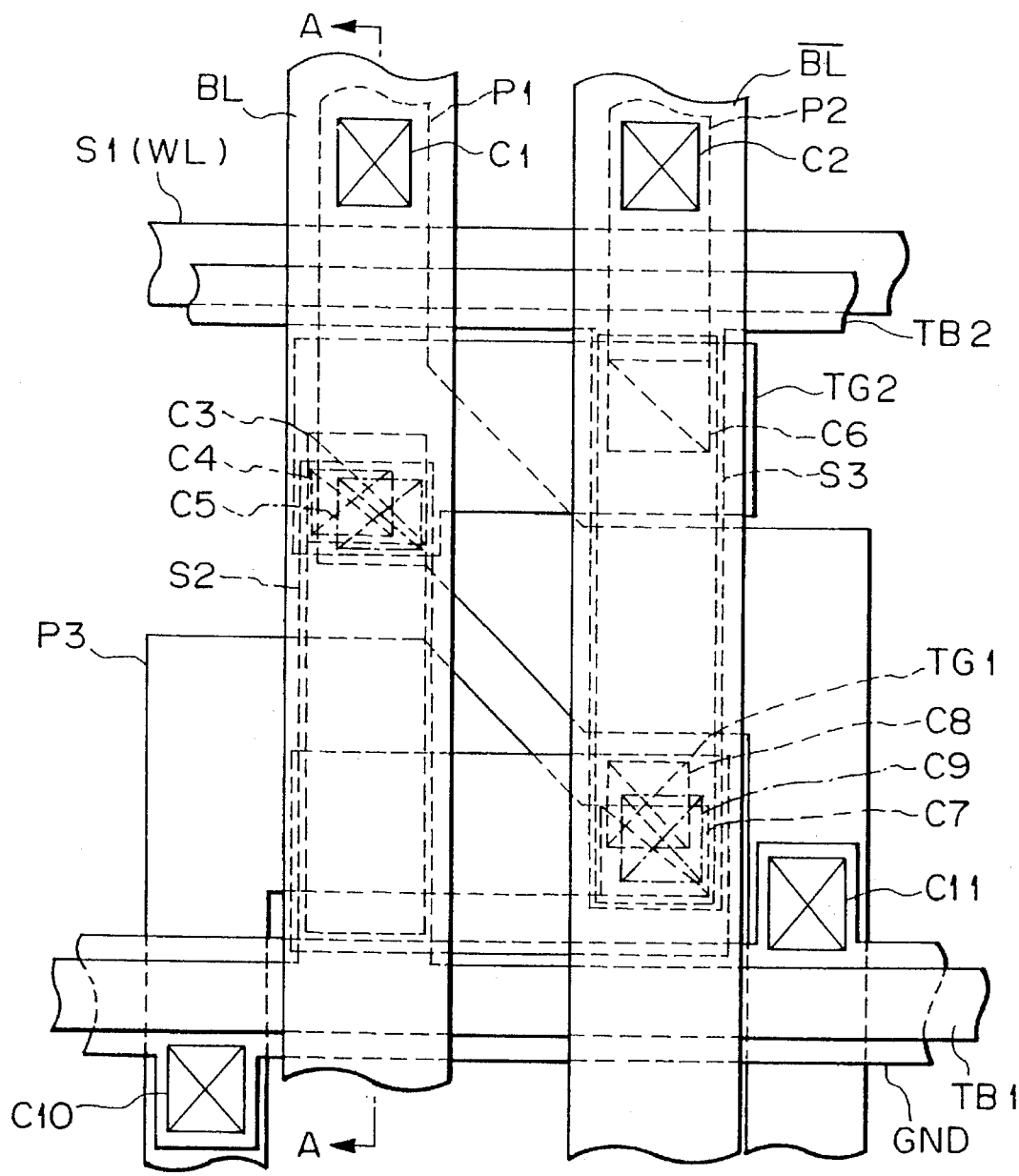
FIG. 2 is a plan view of the SRAM cell of FIG. 1.

Thus, in FIGS. 2 and 3, the following five connection layers are formed:

1st: S1, S2 and S3
2nd: GND
3rd: TG1 and TG2
4th: TB1 and TB2
5th: BL and $\overline{BL}$.

References C1 through C11 designate contacts which serve as follows:

the contact C1 connects the MOS transistor Q5 to the bit line BL;

the contact Q2 connects the MOS transistor Q6 to the bit line $\overline{BL}$;

the contact C3 connects the drain region of the MOS transistor Q3 to the gate electrode of the MOS transistor Q4;

the contact C4 connects the conductive layer S2 to the gate electrode TG2 of the TFT Q2;

the contact C5 connects the gate electrode TG2 to the drain region TB1 of the TFT Q1;

the contact C6 connects the impurity region P2 to the gate electrode S3 of the MOS transistor Q3;

the contact C7 connects the drain region P3 of the MOS transistor Q4 to the gate electrode S3 of the MOS transistor Q3;

the contact C8 connects the conductive layer S3 to the gate electrode TG1 of the TFT Q1;

the contact C9 connects the gate electrode TG1 of the TFT Q1 to the drain region TB2 of the TFT Q2;

the contact C10 connects the source region P3 of the MOS transistor Q4 to the ground layer GND; and the contact C11 connects the source region P1 of the MOS transistor Q3 to the ground layer GND.

A write operation upon the SRAM cell of FIG. 1, 2 and 3 will be explained below.

When data "1" is written" into the cell, the potentials at the bit lines BL and $\overline{BL}$ are made high (="1") and low (="0"), respectively, and then, these potentials are transmitted via the MOS transistors Q5 and Q6 turned by the word line WL to the nodes N1 and N2, respectively. In this case, the potential at the node N1 is represented by $V_{CC}-V_{TN}-\alpha$ where $V_{TN}$ is a threshold voltage of the MOS transistor Q5; and $\alpha$ is a substrate effect voltage. For example, $V_{CC}=3V$, $V_{TN}=0.7$ V and $\alpha=0.3$ V, and then $V_{CC}-V_{TN}-\alpha =2$ V.

The high potential at the node N1 serves to turn OFF the TFT Q2 and serves to turn ON the MOS transistor Q4. On the other hand, the low potential at the node N2 serves to turn ON the TFT Q1 and serves to turn OFF the MOS transistor Q3. Then, when a sufficiently longer time than a time constant determined by the capacity and resistance of these transistors and the nodes N1 and N2 has passed, the potential at the node N1 is increased from $V_{CC}-V_{TN}-\alpha$ to $V_{CC}$, due to the turning ON of the transistor Q4, thus completing a write operation for data "1".

Also, when writing data "0", the potentials at the bit lines BL and $\overline{BL}$ are made low (="0") and high (="1"), respectively, so as to carry out a similar operation to that described above.

A read operation upon the SRAM cell of FIGS. 1, 2 and 3 will be explained below.

Assume that data "1" is stored in the cell, that is, the TFT Q1 and the MOS transistor Q4 are turned ON, and the TFT Q2 and the MOS transistor Q3 are turned OFF. In this case, the potentials at the bit lines BL and $\overline{BL}$ are pulled up to $V_{CC}$ by load transistors (not shown). Therefore, when the potential at the word line WL is made high, and the bit lines BL and $\overline{BL}$ are selected, the low potential at the node N2 discharges the bit line $\overline{BL}$ through the MOS transistors Q6 and Q4, so that the potential at the bit line $\overline{BL}$ continues to fall for a time period where the word line WL is selected. On the other hand, since the MOS transistor Q3 is turned OFF, the potential at the node N1, i.e., the bit line $\overline{BL}$ remains high. That is, the potentials at the bit lines BL and $\overline{BL}$ become $V_{CC}$ and $V_{CC}-V_B$, respectively, where $V_B$ is a voltage dropped for the time period where the word line WL is selected. This difference in potential between the bit lines BL and $\overline{BL}$ is amplified by a sense amplifier (not shown).

A minimum value $V_{CC1}$ of the power supply voltage $V_{CC}$ by which the above-mentioned write and read operations can be carried out is called a driving power supply voltage limit value.

However, as the device has been fine-structured so as to reduce the width of channels of the transfer gate MOS transistors Q5 and Q6, their threshold voltage $V_{TN}$ is higher due to the short-channel effect, as compared with that of the transistors having the same chanel length and a wider channel width. Therefore, the potential $V_{CC}-V_{TN}-\alpha$ at the node N1 immediately after writting data "1" into the cell has a tendency to decrease, thus inviting an unstable state of the cell. For example, if the threshold voltage $V_{TN}$ due to the fine-structured device is about 0.9 V, the value $V_{CC}-V_{TN}-\alpha$ is actually about 1.8 V.

In the write and read operation of the cells, it is most important that data in the cells are not destroyed. For this purpose, the memory cells should recover to a stable state rapidly, i.e., the above-mentioned potential $V_{CC}-V_{TN}-\alpha$ should be changed to $V_{CC}$ rapidly.

Next, a data hold voltage is explained below. That is, a write operation upon the memory cells is carried out under the condition that $V_{CC}\times V_{CC1}$, and thereafter the control enters a standby state. Then, after a definite time has passed, the power supply voltage $V_{CC}$ is lowered from $V_{CC1}$ to $V_{CC2}$ to retain the data in the memory cells. If a read operation is performed upon the memory cells, the power supply voltage $V_{CC}$ is raised from $V_{CC2}$ to $V_{CC1}$, and after a definite time has passed, a chip selection signal (not shown) is made active to carry out the above-mentioned read operation. In this case, a minimum value $V_{CC2}$ of the power supply voltage $V_{CC}$, by which the read and write operation can be carried out, is called a data hold voltage. This data hold voltage $V_{CC2}$ is determined as follows. That is, generally, without supplying charges to the node N1, the high potential at the node N1 would drop to the ground level due to a node leakage current LN through the impurity regions and a sub threshold leak current LS. To avoid this, charges are supplied from the power supply voltage terminal $V_{CC}$ through the TFT Q1 to the node N1. Here, if an ON current is flowing through the TFT Q1, where $V_{CC}=V_{CC2}$, represented by $IONV_{CC2}$, the following condition is required to maintain the high potential at the node N1:

$IONV_{CC2}>LN+LS$

That is, the larger the value $IONV_{CC2}$, the more stable the data hold characteristic, to thereby reduce the data hold voltage $V_{cc2}$. Actually, $IONV_{cc2}\approx 1\times 10^{-9}A$, $LN\approx 1\times 10^{-13}A$, and $LS\approx 1\times 10^{-15}A$, then $V_{cc2}\approx 1.8V$.

In the above-mentioned prior art SRAM cell, a multilayer configuration is adopted to enhance the integration, and particularly, the bit lines BL and $\overline{BL}$ made of aluminium are located via the insulating layer 7 on the TFT's Q1 and Q2. Also, during a write mode and a standby mode (and a data hold mode), the channel region of the TFT, such as Q1, connected to the node, such as N1, having a high potential is beneath the bit line, such as BL, having the potential $V_{cc}$, and therefore, the threshold voltage of the TFT is affected by the bit line. As a result, this threshold voltage is increased by about 0.2 V. Therefore, in a write mode, a time required to recover the node potential from $V_{cc}-V_{TN}-\alpha$ to $V_{cc}$, i.e., required for obtaining a stable state of the memory cell is increased, to thereby decrease the driving power supply voltage limit value. Also, in a data hold mode, the current $IONV_{cc2}$ is reduced to increase the data hold voltage $V_{cc2}$. Thus, in the prior art SRAM cell, the driving power supply voltage limit value $V_{cc1}$ and the hold voltage $V_{cc2}$ are both increased by about 0.3 V.

Figure 4:
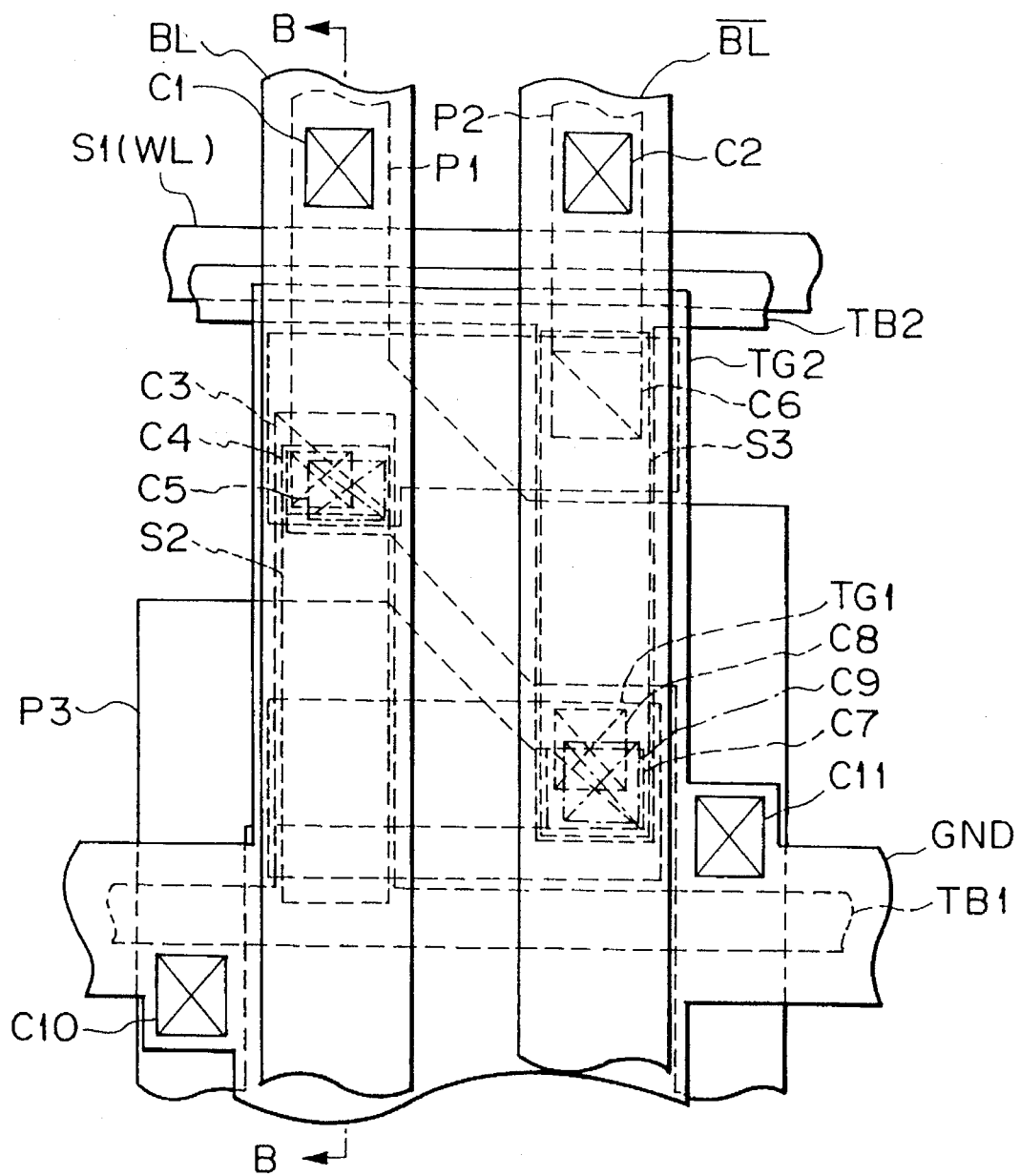
FIG. 4 is a plan view illustrating a first embodiment of the SRAM according to the present invention.
Figure 5:
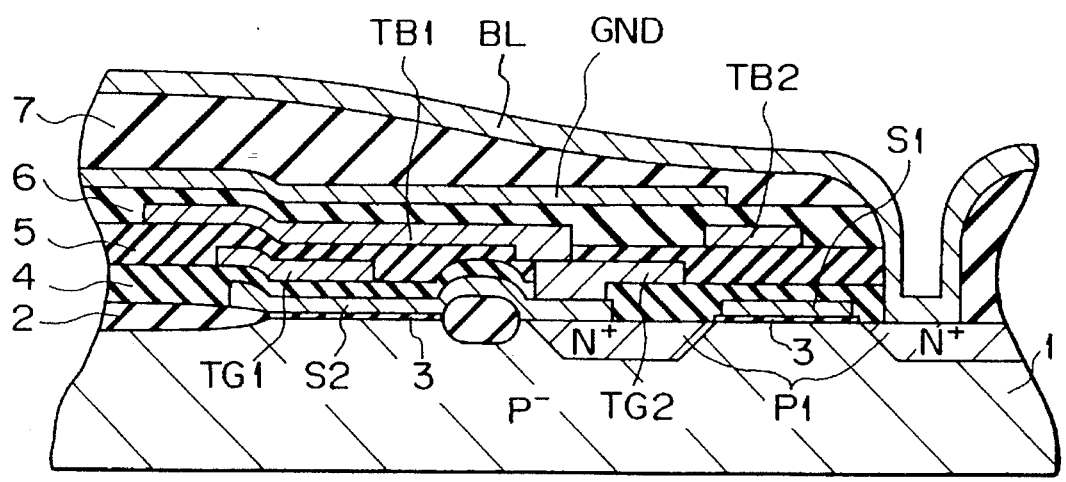
FIG. 5 is a cross-sectional view taken along the line B—B of FIG. 4.

In FIG. 4, which illustrates a first embodiment of the present invention, and in FIG. 5 which is a cross-sectional view taken along the line B—B of FIG. 4, the following five connection layers are formed:

1st: S1, S2 and S3

2nd: TG1 and TG2

3rd: TB1 and TB2

4th: GND

5th: BL and $\overline{BL}$.

That is, the channel regions of the TFT's Q1 and Q2 are sandwiched by the conductive layers (gate electrodes) TG1 and TG2 and the conductive layer (ground layer) GND. As a result, the effect of electric fields generated by the bit lines BL and $\overline{BL}$ upon the channel regions of the TFT's Q1 and Q2 is diminished by the conductive layer GND, since the conductive layer GND is grounded. Also, since the conductive layer GND is interposed between the bit line BL and the channel region (semiconductor layer TB1) of the TFT Q1, and the conductive layer GND opposes the conductive layers (gate electrodes) TG1 and TG2, the effect of electric fields of the bit lines BL and $\overline{BL}$ upon the channel regions of the TFT's Q1 and Q2 can be directly shielded by the conductive layer GND during a write mode and a standby mode (data hold mode) where the potentials at the bit lines BL and $\overline{BL}$ are $V_{cc}$. Thus, the above-mentioned value $V_{cc}-V_{TN}-\alpha$ is increased by about 0.3 V, to thereby reduce the time required to recover from $V_{cc}-V_{TN}-\alpha$ to $V_{cc}$ during a write mode. Also, the current $IONV_{cc2}$ during a data hold mode can be increased by about ten times, to further contribute to stabilization of the cell.

Figure 6:
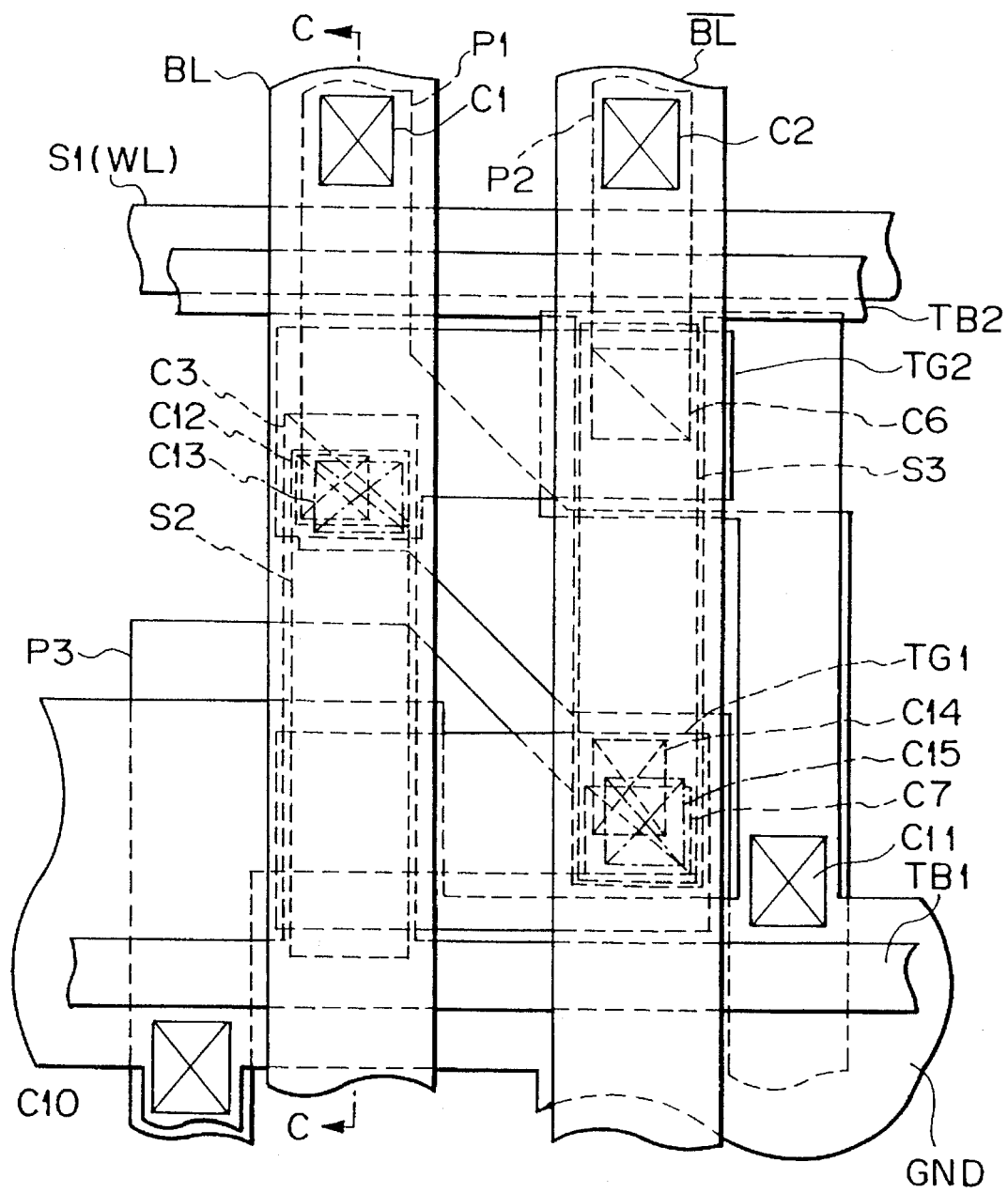
FIG. 6 is a plan view illustrating a second embodiment of the SRAM according to the present invention.
Figure 7:
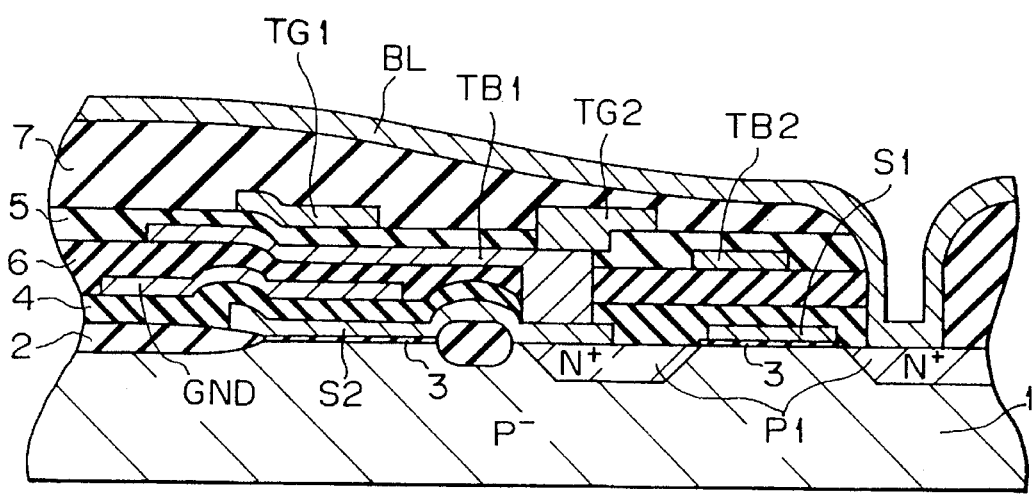
FIG. 7 is a cross-sectional view taken along the line C—C of FIG. 6.

In FIG. 6, which illustrate a second embodiment of the present invention, and in FIG. 7 which is a cross-sectional view taken along the line C—C of FIG. 6, the following five connection layers are formed:

1st: S1, S2 and S3

2nd: GND

3rd: TB1 and TB2

4th: TG1 and TG2

5th: BL and $\overline{BL}$.

That is, also in this case, the channel regions of the TFT's Q1 and Q2 are sandwiched by the conductive layers (gate electrodes) TG1 and TG2 and the conductive layer (ground layer) GND. As a result, the effect of electric fields generated by the bit lines BL and $\overline{BL}$ upon the channel regions of the TFT's Q1 and Q2 can be shielded directly by the conductive layers TG1 and TG2 during a write mode and a standby mode (data hold mode) where the potentials at the bit lines BL and $\overline{BL}$ are $V_{cc}$. Also, since the conductive layer GND opposes the conductive layers (gate electrodes) TG1 and TG2, the effect of electric fields of the bit lines BL and $\overline{BL}$ upon the channel regions of the TFT's Q1 and Q2 is diminished by the conductive layer GND, since the conductive layer GND is grounded. Thus, in the same way as in the first embodiment, the above-mentioned value $V_{cc}-V_{TN}-\alpha$ is increased by about 0.3 V, to thereby reduce the time required to recover from $V_{cc}-V_{TN}-\alpha$ to $V_{cc}$ during a write mode. Also, the current $IONV_{cc2}$ during a data hold mode can be increased by about ten times, to further contribute to stabilization of the cell.

As explained hereinbefore, according to the present invention, since the channel regions of TFT's are sandwiched by their gate electrodes and a ground conductive layer, the effect of electric fields of bit lines upon the channel regions of the TFT's can be diminished, to thereby improve a driving power supply voltage limit value and a data hold voltage of memory cells.

I claim:

1. A static random access semiconductor memory device having a first inverter circuit formed by serially connecting a first load thin film transistor to a first driving MIS transistor and a second inverter circuit formed by serially connecting a second load thin film transistor to a second driving MIS transistor, an output of one of said first and second inverter circuits being connected to an input of the other of said first and second inverter circuits, comprising:

first and second conductive layers, each serving as gate electrodes of said first and second load thin film transistors respectively;

first and second semiconductor layers partly opposing said first and second conductive layers, respectively, said first semiconductor layer having a source region, a channel region and a drain region of said first load thin film transistor, said second semiconductor layer having a source region, a channel region and a drain region of said second load thin film transistor;

a first insulating layer interposed between said first conductive layer and said first semiconductor layer and between said second conductive layer and said second semiconductor layer;

a third conductive layer partly opposing at least the channel regions of said first and second semiconductor layers, for receiving a definite potential; and a second insulating layer interposed between said first semiconductor layer and said third conductive layer and between said second semiconductor layer and said third conductive layer.

2. A device as set forth in claim 1, wherein said first insulating layer is formed on said first and second conductive layers, said first and second semiconductor layers being formed on said first insulating layer, said second insulating layer being formed on said first and second semiconductor layers, said third conductive layer being formed on said second insulating layer.

3. A device as set forth in claim 1, wherein said second insulating layer is formed on said third conductive layer, said first and second semiconductor layers being formed on said second insulating layer, said first insulating layer being formed on said first and second semiconductor layers, said first and second conductive layers being formed on said first insulating layer.

4. A device as set forth in claim 1, wherein said first and second conductive layers are made of polycrystalline silicon.

5. A device as set forth in claim 1, wherein said first and second semiconductor layer are made of polycrystalline silicon obtained by annealling amorphous silicon.

6. A device as set forth in claim 1, wherein said third conductive layer is made of polycide.

7. A device as set forth in claim 1, wherein said third conductive layer is made of high melting-point silicide.

8. A device as set forth in claim 1, further comprising:

first and second bit lines; and first and second transfer gates, each connected between one of said first and second bit lines and one of said first and second inverter circuits, the channel regions of said first and second semiconductor layers extending beneath said first and second bit lines.

9. A static random access semiconductor memory device comprising: first and second bit lines; and a memory cell connected to said first and second bit line;

said memory cell comprising: a first inverter circuit formed by serially connecting a first load thin film transistor to a first driving MIS transistor; a second inverter circuit cross-coupled to said first inverter circuit, formed by serially connecting a second load thin film transistor to a second driving MIS transistor; and first and second transfer gates, each connected between one of said first and second bit lines and one of said first and second inverter circuits, said device comprising:

first and second conductive layers, each serving as gate electrodes of said said first and second load thin film transistors, respectively;

first and second semiconductor layers partly opposing said first and second conductive layers, respectively, said first semiconductor layer having a source region, a channel region and a drain region of said first load thin film transistor, said second semiconductor layer having a source region, a channel region and a drain region of said second load thin film transistor, the channel regions of said first and second semiconductor layers extending beneath said first and second bit lines;

a first insulating layer interposed between said first conductive layer and said first semiconductor layer and between said second conductive layer and said second semiconductor layer;

a third conductive layer partly opposing at least the channel regions of said first and second semiconductor layers, for receiving a definite potential; and a second insulating layer interposed between said first semiconductor layer and said third conductive layer and between said second semiconductor layer and said third conductive layer.

10. A device as set forth in claim 9, wherein said first insulating layer is formed on said first and second conductive layers, said first and second semiconductor layers being formed on said first insulating layer, said second insulating layer being formed on said first and second semiconductor layers, said third conductive layer being formed on said second insulating layer.

11. A device as set forth in claim 9, wherein said second insulating layer is formed on said third conductive layer, said first and second semiconductor layers being formed on said second insulating layer, said first insulating layer being formed on said first and second semiconductor layers, said first and second conductive layers being formed on said first insulating layer.

12. A device as set forth in claim 9, wherein said first and second conductive layers are made of polycrystalline silicon.

13. A device as set forth in claim 9, wherein said first and second semiconductor layer are made of polycrystalline silicon obtained by annealling amorphous silicon.

14. A device as set forth in claim 9, wherein said third conductive layer is made of polycide.

15. A device as set forth in claim 9, wherein said third conductive layer is made of high melting-point silicide.

* * * * *